(12) United States Patent
Anderson et al.

(10) Patent No.: US 7,545,150 B2
(45) Date of Patent: Jun. 9, 2009

(54) DIFFERENTIAL VECTOR NETWORK ANALYZER

(75) Inventors: Keith F. Anderson, Santa Rosa, CA (US); David V. Blackham, Santa Rosa, CA (US); Joel P. Dunsmore, Sebastopol, CA (US); Loren C Betts, Rohnert Park, CA (US); Nicholas C. Leindecker, Stanford, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 42 days.

(21) Appl. No.: 11/680,610

(22) Filed: Feb. 28, 2007

(65) Prior Publication Data
US 2008/0204041 A1 Aug. 28, 2008

(51) Int. Cl.
G01R 35/00 (2006.01)
(52) U.S. Cl. .................... 324/601; 324/615; 324/638; 324/76.12; 324/76.52; 702/106

(58) Field of Classification Search .................. 324/601
See application file for complete search history.

(56) References Cited

U.S. PATENT DOCUMENTS

| | | | | |
|---|---|---|---|---|
| 3,842,418 A | * | 10/1974 | Lorber | 342/200 |
| 6,529,844 B1 | * | 3/2003 | Kapetanic et al. | 702/85 |
| 6,943,563 B2 | * | 9/2005 | Martens | 324/638 |
| 2007/0236230 A1 | * | 10/2007 | Tanbakuchi et al. | 324/650 |
| 2008/0094072 A1 | * | 4/2008 | Noujeim | 324/630 |
| 2008/0164861 A1 | * | 7/2008 | Evers et al. | 324/76.12 |
| 2008/0211515 A1 | * | 9/2008 | Mori et al. | 324/601 |

* cited by examiner

Primary Examiner—Timothy J Dole
Assistant Examiner—Benjamin M Baldridge

(57) ABSTRACT

A measurement and correction method provides for a complete full correction of a true-mode system using only the single ended error matrix developed for 4 port correction of single ended measurements. The degree of misalignment of the balanced sources may be determined from these measurements.

12 Claims, 3 Drawing Sheets

DIFFERENTIAL VECTOR NETWORK ANALYZER

BACKGROUND

Vector network analysis relies on linear behavior from the device-under-test (DUT). However, some active devices must be stimulated in a unique manner to avoid nonlinear operation. To illustrate, a differential amplifier may exhibit distortion when driven with a single-ended signal. It is necessary to drive the inputs with real-time signals that present the proper amplitude and phase relationships. These drive signals must be presented at the input ports (+ and −) of the DUT, with the same amplitude and 180 degrees of phase difference, as a differential signal. For in-circuit applications, a balun (balanced to unbalanced transformer) is often used. It is positioned in close proximity of the device to avoid introducing any phase offset due to connections between the device and the balun. In application, it is difficult to control the interconnections to maintain the desired balance.

SUMMARY

A measurement and correction method provides for a complete full correction of a true-mode system using only the single ended error matrix developed for 4 port correction of single ended measurements. The degree of misalignment of the balanced sources may be determined from these measurements.

DETAILED DESCRIPTION

Figure 1:
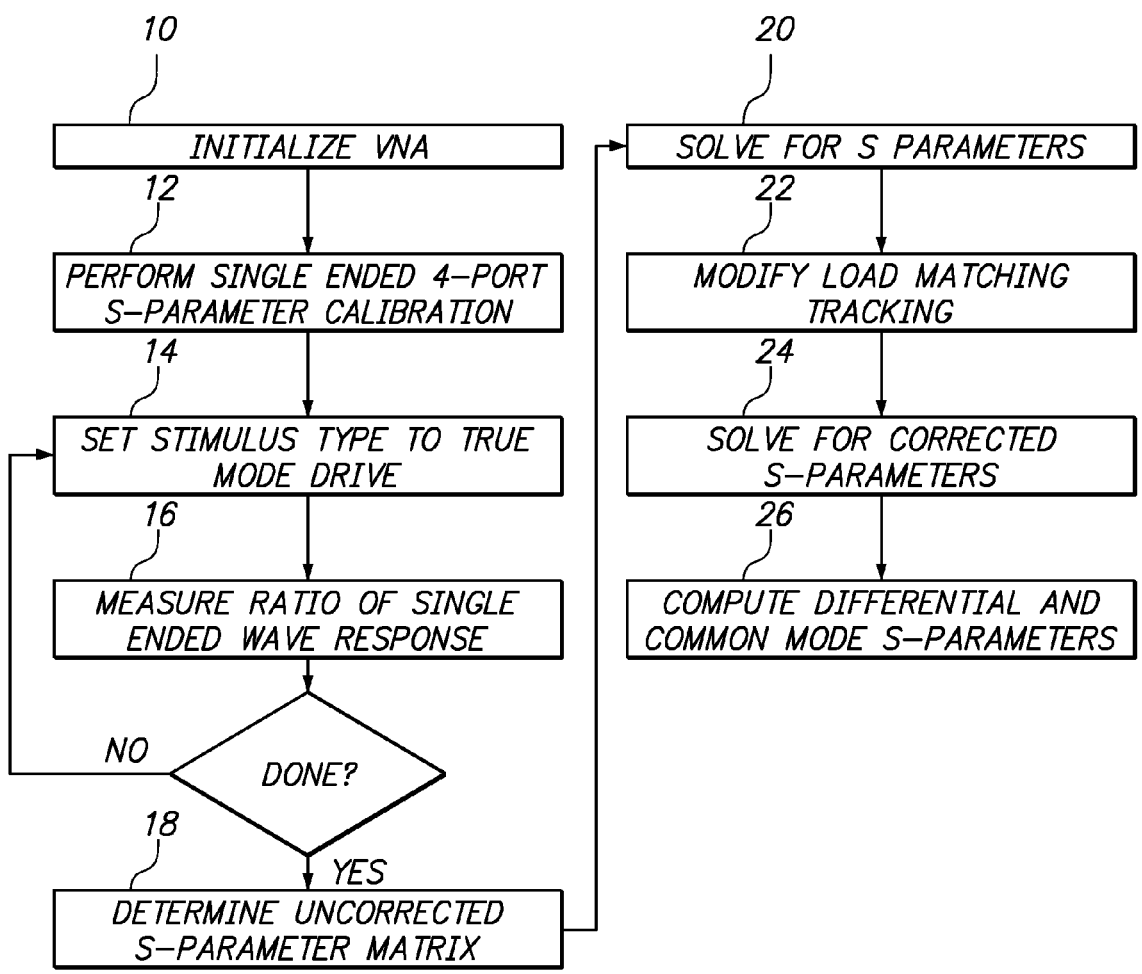
FIG. 1 illustrates a process flowchart for the measurement and correction method.

FIG. 1 illustrates a process flowchart for the measurement and correction method.

Steps 10 and 12 are typical of any measurement technique. In step 10, a 4 port network analyzer is initialized to produce single-ended and true mode balanced drives for the desired frequency range, number of points, and other desired stimuli. In step 12, a single ended full 4 port S-parameter calibration using any technique is performed.

Steps 14-22 depend upon the number of available measurement receivers in the system. Ideally, there is a one to one mapping of measurement receiver to power waves such that all the waves from each drive condition would be simultaneously measured. However, when the reference channel that measures Reference 1-Reference 4 is shared, it is not possible to measure the ratio of these waves at the same time. In most VNA systems, the phase of the measurement receiver may be arbitrary, e.g. from measurement to measurement the phase of any a or b will change. The phase of the ratios of a's to b's will not change. These steps may be repeated for each source setting. In another embodiment, a second measurement is made after one of the reference sources is phase shifted, typically by 90 degrees. Then, power waves may be determined that are attributed to each source In step 14, the stimulus type is changed to a true-mode drive. These modes include a true-mode differential at the input, true-mode common at the input, true-mode differential at the output, and true-mode common at the output. For the true-mode differential mode, the two input signals have a common frequency and are 180 degrees out of phase. For the true-mode common, the input signals have a common frequency and are in phase. In step 16, for each of the drive states selected, the ratio of the single ended wave responses is measured such that the b/a ratio for every b and each of the drive port a's is recorded. The number of data acquisition steps depends upon the total number of simultaneous measurement receivers available. These measurements are made with correction off. In step 18, from each of the drive states, for the matrix equation [b]=[S][a], where b and a are the single ended waves applied at the DUT, [S] is the uncorrected S-parameter matrix. In step 20, the S parameter is found by solving the equation $[S]=[b][a]^{-1}$. This generalized single ended matrix takes into account all the waves present, including mode-crosstalk signal which are present because the true-mode drive is not ideal. In step 22, the standard single ended 4 port error correction arrays are modified to change the load match to the appropriate source match term according to the drive port. The tracking terms are modified accordingly.

In step 24, the 4-port error correction matrix is applied using the modified correction arrays to the [S] matrix to find the corrected S parameters. This represents the error-corrected single ended S-parameters measured under true-mode drive conditions.

In step 26, the standard mixed mode math is applied to compute the differential and common mode S-parameters from the corrected single ended S-parameters.

Figure 2:
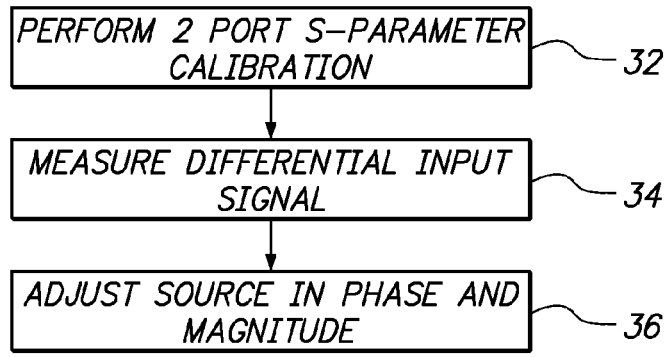
FIG. 2 illustrates a process flowchart for steps 12 and 14 shown in FIG. 1.

FIG. 2 illustrates a process flow chart for steps 12 and 14 shown in FIG. 1.

Figure 5:
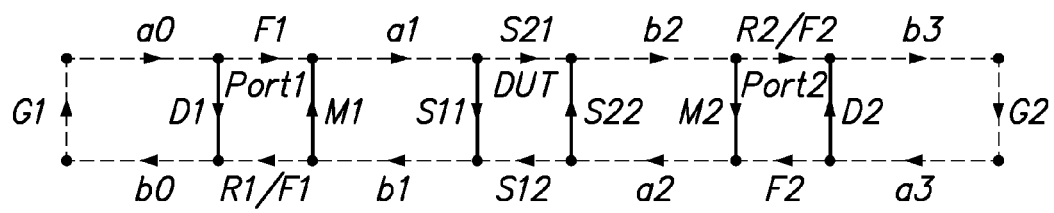
FIG. 5 illustrates the error box model.

In step 32, a 2 port S-parameter calibration is performed. The standard 2 port VNA error model may be represented by an error box model as shown in FIG. 5. The power wave labels are a0-a3 and b0-b3. D1 and D2 represent the directivity terms for ports 1 and 2. M1 and M2 represent the source match terms for ports 1 and 2. R1 and R2 represent the reflection tracking terms for ports 1 and 2. F1 and F2 are variables where F1/F2 is constant. G1 and G2 represent switch match terms. G2 is used to generate a3 during forward (port 1 to port 2) measurements, and G1 is used to generate a0 during reverse (port 2 to port 1) measurements. This step may be omitted when a 4-port calibration has been performed as the 2-port error terms may be derived from the 4-port error terms.

In step 34, the differential input signal is measured. Phase (a1/a2) is the phase difference between the signals incident on ports 1 and 3. This value should be 180 degrees for a true differential signal. Mag(a1/a2) is the magnitude ratio of the signals incident on ports 1 and 2. This value should be unity for a properly balanced differential signal.

In step 36, the source offset is adjusted in phase and magnitude. The amplitude of one or both of the sources is adjusted such that Mag(a1/a2) is unity while the phase of one or both of the sources is adjusted to 0 degrees for a common mode signal or 180 degrees for a differential mode signal.

In operation, it may be necessary to iteratively adjust the magnitude and phase as the parameters are coupled. In addition, if the automatic level control (ALC) is operating in either source, then one source may pull the other resulting in amplitude changes. As this complicates amplitude adjustments, the ALC may be turned off before measuring.

Figure 3:
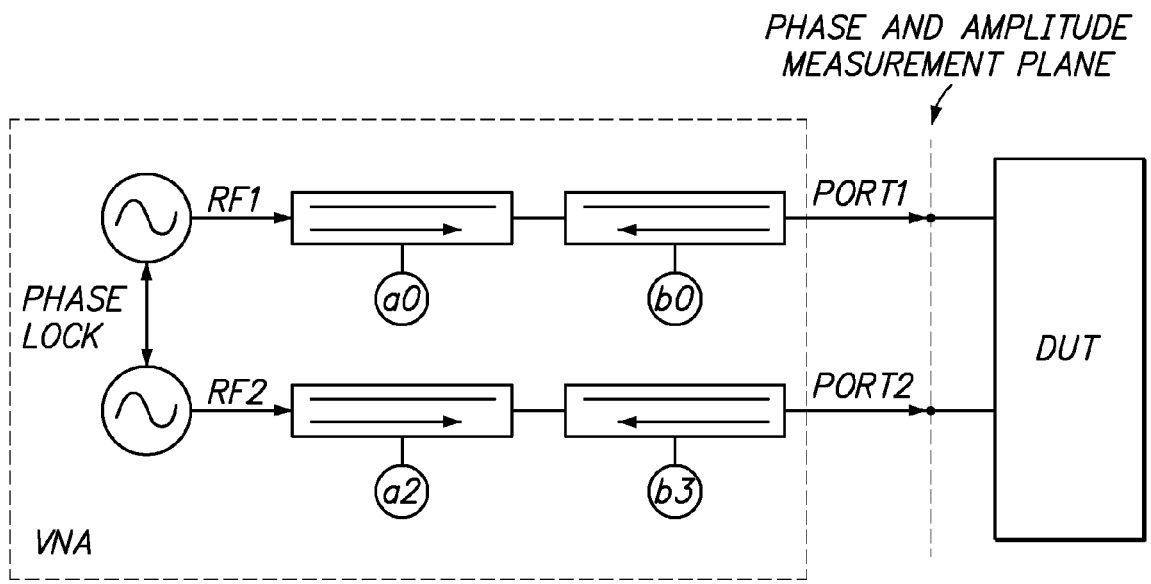
FIG. 3 illustrates a functional block diagram for the process shown in FIG. 2.

FIG. 3 illustrates a block diagram for the process shown in FIG. 2. The vector network analyzer interface to a device under test (DUT) at the phase and amplitude measurement plane, port 1 and port 2. The VNA includes two reference sources that have been phase controlled. The output of each source is measured using reflectometers that are positioned proximate to the measurement plane.

The two separate RF sources are synthesized and phase controlled together. The RF sources are set to frequencies that satisfy the equation RF1=(N/M)*RF2, where N and M are integers. This ensures that the relative phase between the sources can be defined, measure, and set. While the embodiment discloses two separate sources, one can easily extend the concept to synthesize and phase lock multiple sources. In this example, N/M=1 as the two frequencies are the same.

Figure 4A:
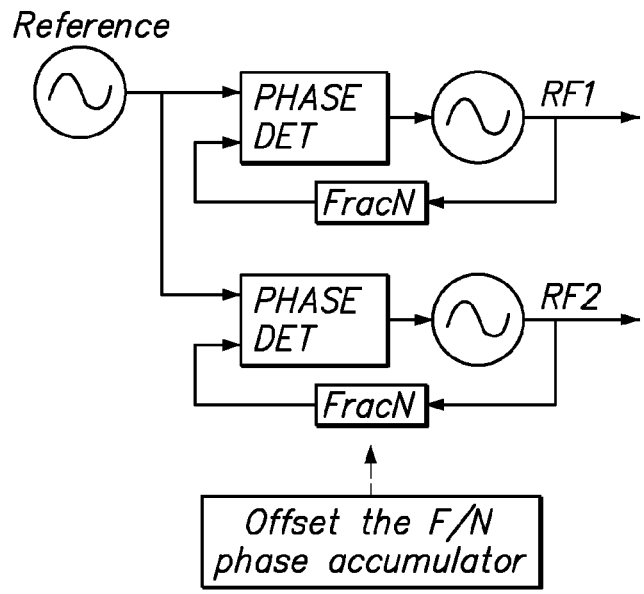
FIGS. 4A-C illustrates embodiments used for phase-controlled sources with programmable phase differences.
Figure 4B:
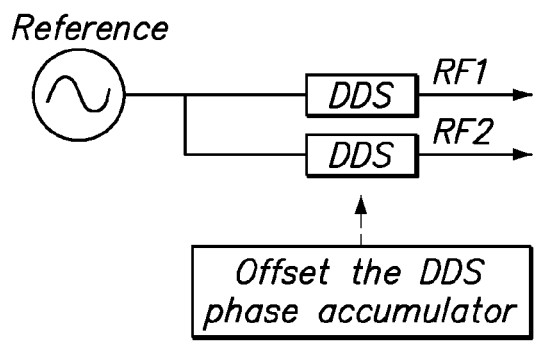
Figure 4C:
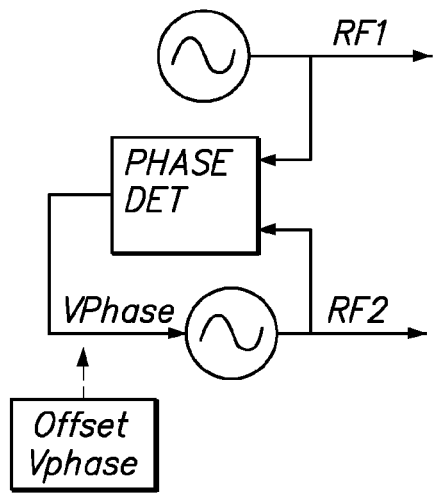

FIGS. 4A-C illustrates embodiments used for phase-controlled sources with programmable phase differences.

FIG. 4A illustrates Fractional-N Phase Offset. The Fractional-N phase controlled loops are locked to a common reference. Each phase controlled loop includes a phase detector receiving the common reference signal and an output of a fractional N controller. An oscillator receives the output of the phase detector. The output of the oscillator is the RF signal. The Fractional-N controller receives as an input the RF signal. One of the Fractional-N controller further receives an output of a fractional N phase accumulator that performs the phase offseting.

FIG. 4B illustrates a Direct Digital Synthesizer phase offset. Similar to FIG. 4A, the synthesizers are locked to a common reference source. The output of each synthesizer is a reference signal. One of the synthesizers further receives an output of a fractional N phase accumulator that performs phase offsetting.

FIG. 4C illustrates RF loop Voltage phase offset. RF1 is any RF source. A phase detector receives the output of a first RF source RF1 and an output of a second RF source RF2. The output DC voltage of the phase detector represents the phase shift of RF2 relative to RF1. Vphase is a variable DC voltage typically provided by a digital-to-analog converter.

We claim:

1. An instrument, comprising:
two phase controlled frequency sources, wherein one of the two phase controlled frequency sources includes phase offset control, the two phase controlled frequency sources further including:
a common frequency source generating a first reference signal;
an oscillator generating a second reference signal;
a phase detector receiving the first and second reference signals;
the oscillator receiving the output of the phase detector and a voltage phase offset signal; and,
for each frequency source, a reflectometer interposes the source and a port of a device under test.

2. An instrument, comprising:
two phase controlled frequency sources, wherein one of the two phase controlled frequency sources includes phase offset control, the two phase controlled frequency sources further including:
a common frequency source;
two paths connected to the common frequency source, each path including:
a phase detector receiving the common frequency source;
an oscillator receiving the output of the phase detector generating a reference signal;
a fractional N controller receiving the output of the oscillator; and the phase detector receiving the output of the fractional N controller;
for one of two paths, the fractional N controller receiving an output of a phase accumulator;
for each frequency source, a reflectometer interposes the source and a port of a device under test.

3. An instrument, comprising:
two phase controlled frequency sources, wherein one of the two phase controlled frequency sources includes phase offset control, the two phase controlled frequency sources further including:
a common frequency source;
two paths connected to the common frequency source, each path including:
a direct digital synthesizer receiving the common frequency source, generating a reference signal; and
for one of the two paths, the direct digital synthesizer receiving an output of a phase accumulator;
for each frequency source, a reflectometer interposes the source and a port of a device under test.

4. A method comprising:
initializing a network analyzer for single ended and dual output drives, wherein the network analyzer includes two phase controlled frequency sources, wherein one of the two phase controlled frequency sources includes phase offset control, for each frequency source, a reflectometer interposes the source and a port of the device under test;
performing a single ended full port S-parameter calibration; and
changing a stimulus type to a drive type based on the S-parameter calibration data, wherein:
the drive type is selected from a group including true-mode differential at the input, true mode common at the input, true mode differential at the output and true-mode common at the output.

5. A method as in claim 4, further comprising: for each drive state,
measuring the ratio of the single ended wave response, determining the uncorrected S-parameter matrix, and solving the uncorrected S-parameter matrix;
modifying the port error correction array according to the drive port;
applying the port error correction matrix to find the conected S parameters; and
computing the differential and common mode S-parameters.

6. A method as in claim 4, wherein the single ended full port S-parameter calibration is a 4-port S-parameter calibration.

7. A method as in claim 4, performing a single ended full port S-parameter calibration including:
performing a 2 port S-parameter calibration;
measuring a differential input signal; and
adjusting the source offset in phase and magnitude.

8. A method as in claim 7, adjusting the source offset including adjusting the amplitude of at least one source such that Mag(al/a2) is unity when the phase offset is set to approximately 0 degrees for a common mode signal.

9. A method as in claim 7, adjusting the source offset including adjusting the amplitude of at least one source such that Mag(al/a2) is approximately 180 degrees for a differential mode signal.

10. A method as in claim 4, further comprising:
phase shifting one of the reference sources; and
measuring one of the amplitude and phase of the power waves attributed to each source.

11. A method as in claim 10, wherein the reference source is phase shifted by 90 degrees.

12. A method as in claim 4, further comprising adjusting the relative amplitude and phase of one of the sources based on the S parameter calibration data.

* * * * *